United States Patent

Dunsmore et al.

Patent Number: 6,065,137
Date of Patent: May 16, 2000

[54] NETWORK ANALYZER MEASUREMENT METHOD USING ADAPTIVE SIGNAL PROCESSING

[75] Inventors: Joel P. Dunsmore, Sebastopol; Michael S. Marzalek, Bodega Bay; Susan Wood, Santa Rosa, all of Calif.

[73] Assignee: Hewlett-Packard Company, Palo Alto, Calif.

[21] Appl. No.: 09/056,149

[22] Filed: Apr. 6, 1998

[51] Int. Cl.[7] .............................. G06F 13/00; G01N 21/00
[52] U.S. Cl. .............................................. 714/37; 356/73.1
[58] Field of Search .............................. 714/37, 735, 736, 714/737, 47; 356/731

[56] References Cited

U.S. PATENT DOCUMENTS

| 5,127,725 | 7/1992 | Mueller et al. | 356/73.1 |
| 5,508,802 | 4/1996 | Boehme et al. | 356/73.1 |
| 5,919,268 | 7/1998 | McDonald | 714/47 |
| 5,923,832 | 7/1998 | Shirakihara | 395/182.13 |
| 5,961,654 | 10/1998 | Levine et al. | 714/47 |

*Primary Examiner*—Norman Michael Wright
*Attorney, Agent, or Firm*—John L. Imperato

[57] ABSTRACT

A network analyzer measurement method adaptively adjusts measurement parameters of the network analyzer, based on a set of measurements of a device under test (DUT) and according to a user-specified limit contour, maximum permissible measurement error or other decision criteria. Measurement speed of the network analyzer is optimized by performing subsequent measurements on the DUT using the adjusted measurement parameters. Measurement bandwidth, the number of measurement sweeps or the frequency location of stimulus points of the analyzer is optimized when characterizing the DUT.

20 Claims, 4 Drawing Sheets

NETWORK ANALYZER MEASUREMENT METHOD USING ADAPTIVE SIGNAL PROCESSING

BACKGROUND OF THE INVENTION

Measurement speed is a critical performance parameter of modern network analyzers. When network analyzers are used in manufacturing environments, measurement speed directly impacts measurement throughput and measurement costs. Therefore, various approaches have been used to increase measurement speed. For example, rather than performing many measurements at uniform, finely-spaced frequency locations, a user may specify that measurements be performed at a limited number of non-uniformly-spaced frequency locations chosen according to the anticipated electrical performance characteristics of a device under test (DUT). Alternatively, the user may set the measurement bandwidth of the network analyzer to be wide, or may specify a low number of measurement sweeps of the DUT to increase measurement speed. In each of these approaches, the user of the network analyzer specifies measurement parameters of the network analyzer, such as the number and location of measurement points, the measurement bandwidth, or the number of measurement sweeps based on presumed electrical characteristics of the device under test (DUT). Because the presumed electrical characteristics differ from actual electrical characteristics of the DUT, these user-specified measurement parameters compromise measurement accuracy of the network analyzer. Accordingly, there is a need for a measurement method that is independent of presumed electrical characteristics of the DUT, and that increases measurement speed of the network analyzer without unduly compromising measurement accuracy.

SUMMARY OF THE INVENTION

The availability of high-speed microprocessors and digital signal processors enables measured data within a network analyzer to be manipulated and processed much faster than the measured data can be acquired by the network analyzer. As a result, measurement speed of the network analyzer is inherently limited by the number of stimulus points at which measurements are performed, by the measurement bandwidth of the network analyzer, or by the number of measurement sweeps taken by the network analyzer to characterize a device under test (DUT). According to the preferred embodiments of the present invention, a network analyzer measurement method performs a preliminary measurement of the DUT, processes the measured data and based on the processed data adaptively adjusts measurement parameters of the network analyzer, such as the number and frequency location of measurement points (point optimization), the measurement bandwidth (bandwidth optimization), or the number of measurement sweeps performed (noise optimization). Subsequent measurements on the DUT are performed using the adjusted measurement parameters. Reducing the number of stimulus points or the number of measurement sweeps increase the measurement speed of the network analyzer. Increasing the measurement bandwidths also increases the measurement speed of the network analyzer. Because the measurement parameters are adjusted according to actual measured electrical characteristics of the DUT, rather than presumptions about the characteristics of the DUT, measurement speed is optimized without an indiscriminant compromise in measurement accuracy. The point optimization, noise optimization, and bandwidth optimization provide for maximum measurement speed based on a user-specified maximum permissible measurement error, a user-specified limit contour for the DUT or other decision criteria supplied to the network analyzer.

DETAILED DESCRIPTION OF THE PREFERRED EMBODIMENT

Figure 1:
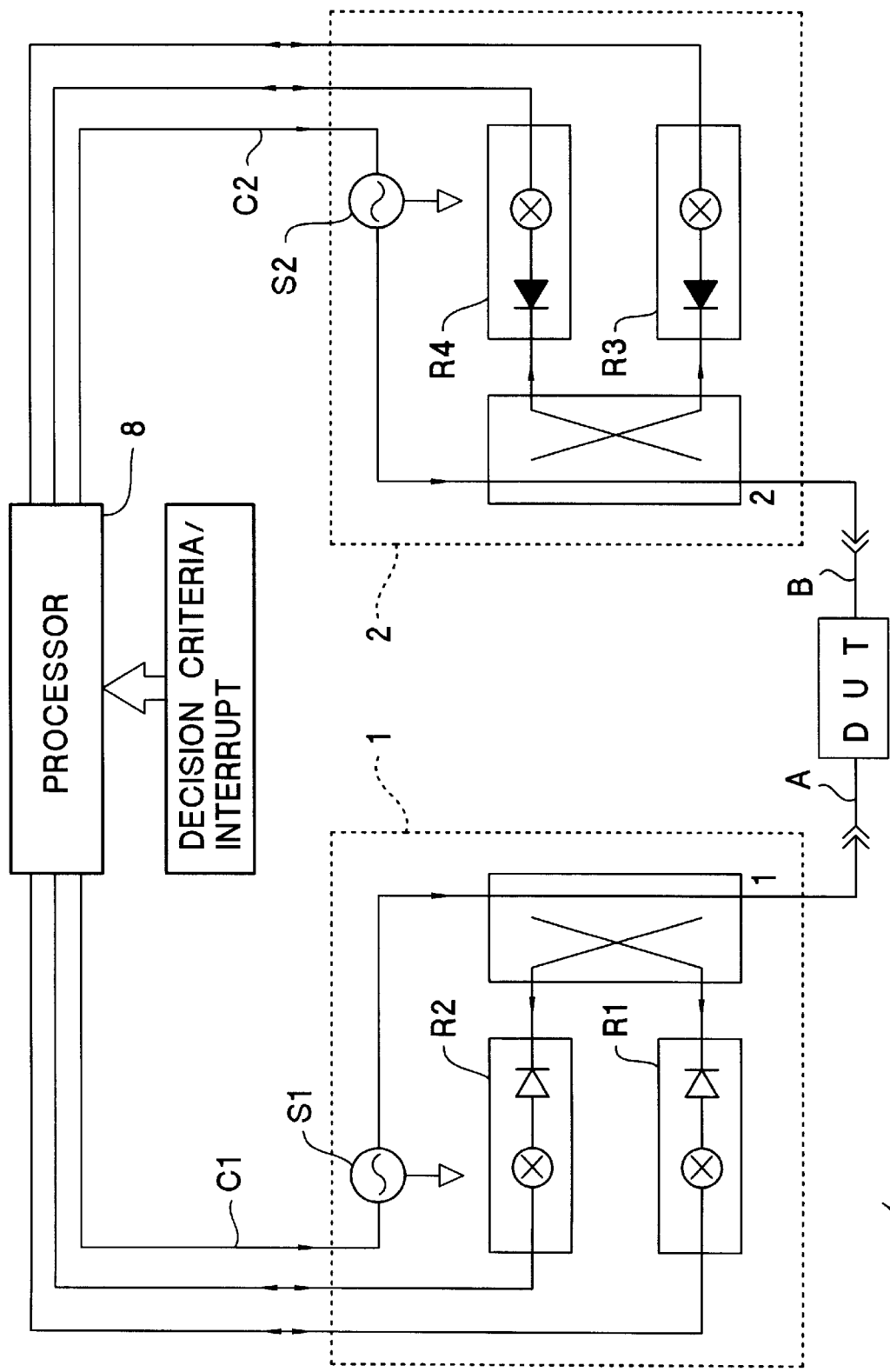
FIG. 1 shows a network analyzer used with the network analyzer measurement method constructed according to the preferred embodiment of the present invention.

FIG. 1 shows a network analyzer 10 used with the network analyzer measurement method constructed according to the preferred embodiment of the present invention. Stimulus/acquisition units 1, 2 provide test signals, or stimuli, to the device under test (DUT). Typically, the stimuli are supplied alternately to port A and to port B of the DUT by signal sources S1 and S2, respectively, depending on the DUT and the specified measurement sequence. For example, when a reflection measurement S11 or a transmission measurement S21 is performed on the DUT, a stimulus is provided to port A of the DUT by signal source S1. When a reflection measurement S22 or a transmission measurement S12 is performed, a stimulus is provided to port B of the DUT by signal source S2.

In addition to providing stimuli to the DUT, units 1, 2 also acquire measurements of the DUT using one or more receivers R1–R4 within the units 1, 2. For example, when a reflection measurement S11 is performed on the DUT, measurements are acquired by unit 1 using receivers R1, R2. When a reflection measurement S22 is performed on the DUT, measurements are acquired by unit 2 using receivers R3, R4. When a transmission measurement S21 or S12 is performed on the DUT, measurements are performed simultaneously by unit 1 and unit 2 using corresponding receivers within each of the units 1, 2. Measured data for the DUT is supplied to a processor 8 from units 1 and 2 where it is processed to provide control of measurement parameters of the network analyzer 10.

The measurement bandwidth of the receivers R1–R4 within each of the units 1, 2 is independently adjustable. The frequency, power or other characteristics of the stimuli supplied by signal source S1 and signal source S2 are independently adjustable via control signals C1, C2. Control signal C1 adjusts signal source S1 and control signal C2 adjusts signal source S2.

Measurement speed of the network analyzer 10 with which the DUT is characterized is optimized using bandwidth optimization, noise optimization, or point optimization. Bandwidth optimization is performed according to the first preferred embodiment of the present invention. Noise optimization is performed according to the second preferred embodiment of the present invention. Point optimization is performed according to the third preferred embodiment of the present invention. Each of the bandwidth, noise and point optimizations are performed independently or the optimizations are performed in combination to increase the measurement speed of the network analyzer 10.

Bandwidth optimization:

Generally, measurement speed of the network analyzer is increased by increasing the measurement bandwidth of the one or more of receivers R1–R4 that are used to perform measurements of the DUT. Depending on the type of receivers R1–R4 and filters used within the network analyzer, the measurement bandwidth is controlled by adjusting analog filters implemented in hardware within the receivers. Alternatively, the measurement bandwidth is controlled by adjusting the processing bandwidth of digital filters within the network analyzer 10, for example by updating coefficients of the digital filters.

However, increasing the measurement bandwidth also increases the noise component of the measurement, which correspondingly increases the measurement error or uncertainty. The gain in measurement speed, due to increased measurement bandwidth, is weighed against the resulting increase in measurement error. Bandwidth optimization balances the increase in measurement speed against the maximum permissible measurement error, the performance limit contour for the DUT or other user-specified decision criteria supplied to the processor 8. Measurements of the DUT within a preliminary data set acquired by units 1, 2 are also applied to the processor 8 which compares the measurements to the decision criteria. The processor 8 then adjusts measurement bandwidth based on the comparisons, so that the measurement bandwidth of the network analyzer is set as wide as possible while still satisfying the decision criteria. For example, the measurement bandwidth may be set to the maximum width at which a sufficiently low measurement error is still achieved. Alternatively, the measurement bandwidth is set to the maximum width at which the mean plus the variance are within the performance limit contour for the DUT by a sufficient amount. The limit contour for the DUT may be a series of lines, curves or points, for example, specifying the passband or stopband when the DUT is a filter, or specifying minimum or maximum gain when the DUT is an amplifier, or any other type of limit contour used to specify performance requirements of the DUT. This decision criterion is satisfied when the measurements of the DUT exceed the performance requirements specified by the limit contour. The maximum permissible error for the DUT is a specified range within which measurement variances, measurement uncertainty or measurement error is required to fall. This decision criterion is satisfied when these characteristics of the measurements fall within the maximum permissible error by a predefined amount. The decision criterion may also be a predefined signal amplitude measured by stimulus/acquisition units 1, 2 and this decision criterion is satisfied when the measurements of the DUT are within a predetermined range of the predefined amplitude, or alternatively, when the measurements are outside the predetermined range of the predefined amplitude.

Figure 2A:
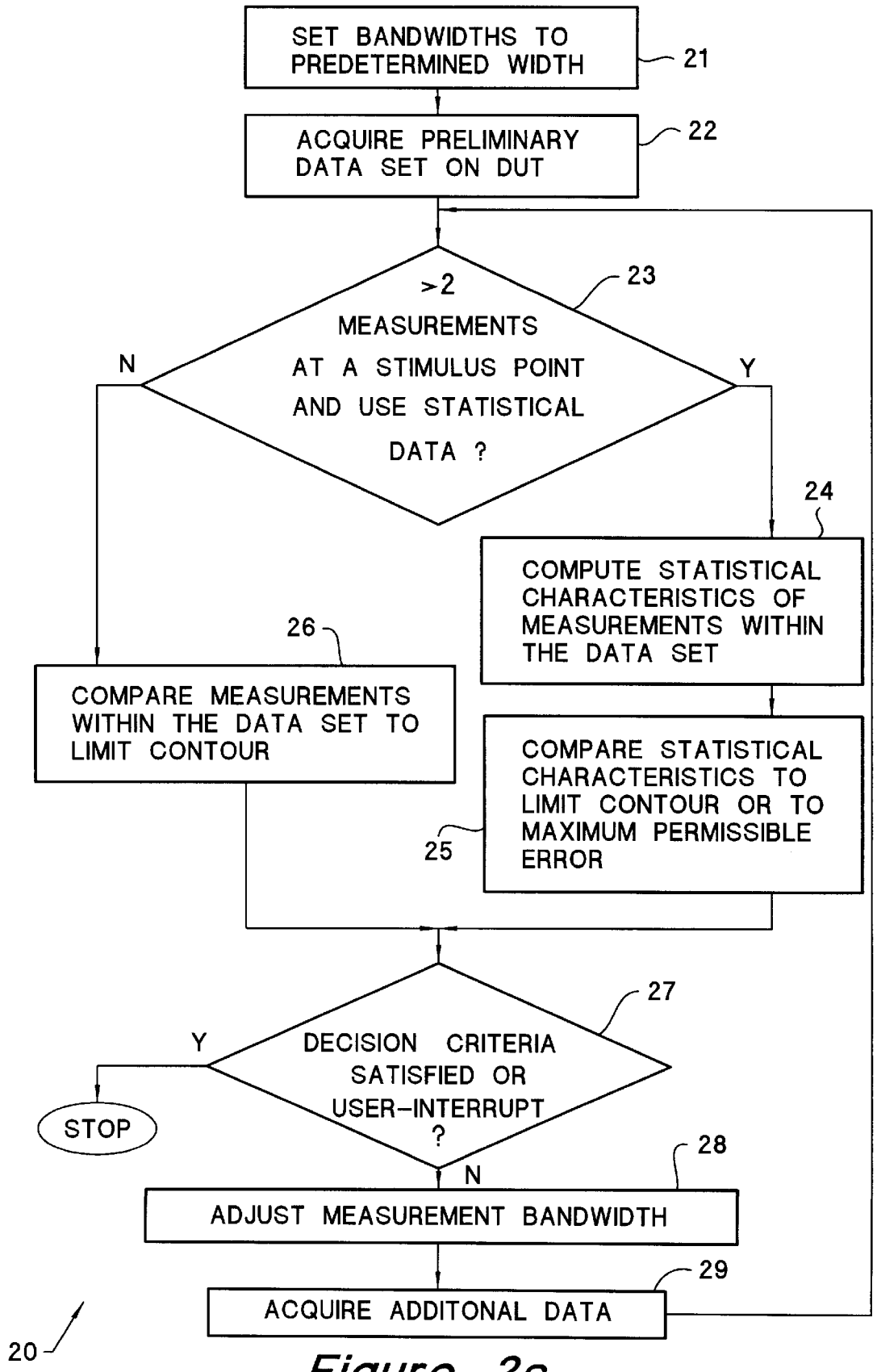
FIG. 2a shows a flow diagram of a network analyzer measurement method constructed according to the first preferred embodiment of the present invention.

FIG. 2a is a flow diagram 20 of the measurement steps of the bandwidth optimization included in the measurement method constructed according to the first preferred embodiment of the present invention. In step 21, the measurement bandwidths of the receivers R1–R4 are adjusted to predetermined widths. The predetermined widths are based on measurement characteristics acquired from a previously measured DUT or are user-specified default widths. In this example, the predetermined widths are the maximum measurement bandwidths of the network analyzer, or alternatively, are sufficiently wide so that preliminary measurements of the DUT are performed at high measurement speed.

In step 22, a preliminary data set is acquired with the measurement bandwidths set to the predetermined widths. The network analyzer is configured so that the preliminary data set includes a series of measurements performed at different frequency locations, or alternatively, so that the predetermined data set includes two or more measurements performed at each frequency location. A choice is made in step 23 as to whether or not statistical characteristics of measurements within the data set are computed and compared to the decision criteria. If statistical characteristics are not relied upon in step 23, step 26 follows step 23. In step 26, the processor 8 compares each of the measurements in the preliminary data set to a user-specified limit contour and a decision is made in step 27, based on the comparison. If the performance of the DUT is sufficient, based on the comparison made in step 26, the measurement sequence is terminated. If the measurement sequence is not terminated, the measurement bandwidths are left at the predetermined widths, or one or more of the measurement bandwidths within the network analyzer 10 are adjusted in step 28. In this step 28, the measurement bandwidths are increased relative to the predetermined width, or maintained at the maximum width when the predetermined width was the maximum width, when the measured data in the data set is within the limit contour by a sufficient amount. The measurement bandwidth is decreased relative to the predetermined width when the measured data in the data set is not within the limit contour by a sufficient amount. Subsequent measurements are performed using the adjusted measurement bandwidths and additional data on the DUT is taken to better characterize the DUT in step 29. This additional data acquired in step 29 is then combined with the data in the preliminary data set and the measurement steps 23–29 in the bandwidth optimization measurement method 20 are repeated until the decision criteria are satisfied.

When the network analyzer 10 is configured so that the preliminary data set, or the preliminary data set and any additionally acquired data in step 29, include at least two measurements performed at a frequency location, statistical characteristics of the measurements within the data set are computed and compared to the decision criteria. In step 24, statistical characteristics of the measurements within the data set, such as the mean and variance of the measurements, are computed by the processor 8. The statistical characteristics are compared to the user-specified limit contour in step 25 and the measurement bandwidth is adjusted based on the comparison in step 28. The measurement bandwidth is increased relative to the predetermined width, or left at the maximum measurement bandwidth when the predetermined width was the maximum, when the mean and variance of the measured data in the preliminary data set are within the limit contour by a sufficient amount. The measurement bandwidth is decreased relative to the predetermined width when the mean and measurement uncertainty or error, indicated by the variance of the measurements within the data set, are not within the limit contour by a sufficient amount.

Alternatively, the statistical characteristics, such as the variance of the measurements in the data set is compared to a user-specified maximum permissible error in step 25, and the bandwidth is adjusted based on the comparison in step 28. The measurement bandwidth is increased relative to the predetermined width, or left at the maximum width when the predetermined width was the maximum width, when the variance of the measured data in the preliminary data set is less than the maximum permissible measurement error by a sufficient amount. The measurement bandwidth is decreased relative to the predetermined width when the variance of the measured data in the preliminary data set is not less than the maximum permissible measurement error by a sufficient amount.

Subsequent measurements are performed using the adjusted measurement bandwidths, and additional data on the DUT is taken to better characterize the DUT in step 29. This additional data acquired in step 29 is then added to the data in the preliminary data set and the measurement steps 23–29 in the bandwidth optimization are repeated.

When the comparisons performed in step 25 and step 26 determine that the DUT has been sufficiently characterized by the preliminary data set or by the preliminary data set combined with subsequent measurements of the DUT, the measurement sequence can be terminated. The bandwidth optimization increases the measurement speed of the DUT since the bandwidth optimization measurement method 20 adaptively adjusts the measurement parameters of the network analyzer so that measurements are performed and measurement parameters are adjusted until the DUT is appropriately characterized to meet performance criteria with a sufficient level of confidence. While user-specified limit contours or maximum permissible error are the decision criteria shown in FIG. 2a, other decision criteria may be used. For example, absolute power level, or signal amplitudes of the measurements in the data set, local derivatives, or changes in measurement values between adjacent or prior measurements may also be used as the decision criteria. When the decision criteria are satisfied or if the measurements of the DUT are interrupted in step 27, the bandwidth optimization may be terminated.

Noise optimization:

Measurement speed of a network analyzer is also increased by reducing the number of measurement repetitions, or measurement sweeps, performed on the DUT. Reducing the number of sweeps, reduces the number of averages, or the averaging factor, of the measurement. However, reducing the averaging factor increases the noise component of the measurement and correspondingly increases the measurement uncertainty, or error, because averaging reduces the noise component of the measurement by a factor equal to the square root of the number of measurement sweeps. For example, averaging sixteen repeated measurement sweeps performed on the DUT reduces the noise component of the measurement by a factor of four whereas averaging nine repeated measurement sweeps performed on the DUT reduces the noise component of the measurement by a factor of 3. The gain in measurement speed due to reducing the averaging factor is weighed against the corresponding increase in measurement uncertainty, or error due to the increased noise component.

Noise optimization balances the increase in measurement speed against the maximum permissible measurement error, the performance limit contour for the DUT or other decision criteria according to a preliminary measurement of the DUT. The preliminary measurement acquired by units 1, 2 is applied to the processor 8 which compares the preliminary measurement to the decision criteria. The processor 8 then adjusts the stimuli using control signals C1, C2 based on the comparisons, so that number of measurement sweeps is set as low as possible while still satisfying the decision criteria. For example, the number of measurement sweeps may be set to the lowest number at which a sufficiently low measurement error is still achieved. Alternatively, the number of measurement sweeps is set to the lowest number at which the mean plus the variance are within the performance limit contour for the DUT by a sufficient amount.

Figure 2B:
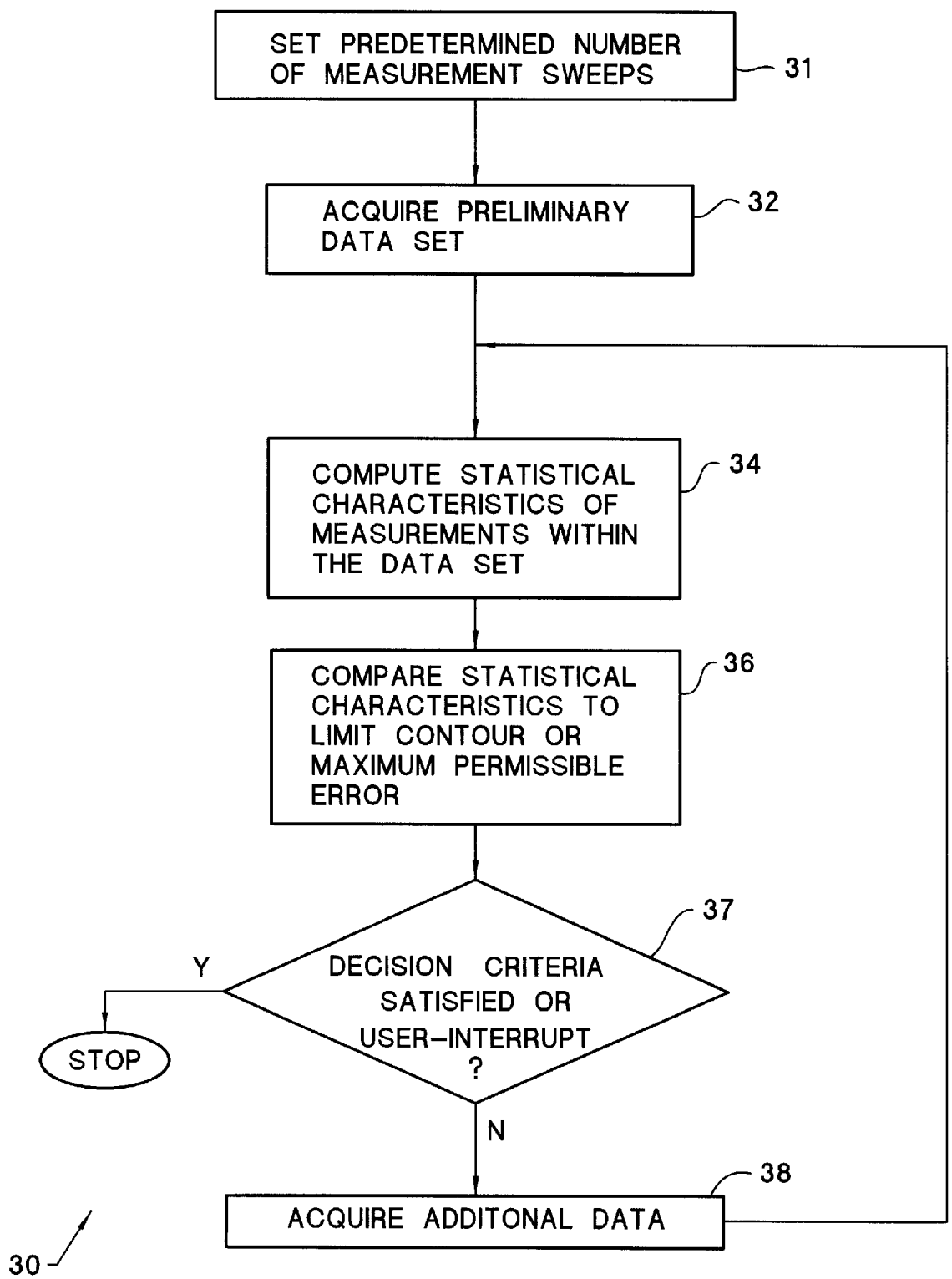
FIG. 2b shows a flow diagram of a network analyzer measurement method constructed according to the second preferred embodiment of the present invention.

FIG. 2b is a flow diagram of the measurement steps of the noise optimization included in the measurement method 30 constructed according to the second preferred embodiment of the present invention. In step 31, the number of measurement sweeps is set to a predetermined number. The predetermined number is based on measurement characteristics acquired from a previously measured DUT or is a user-specified default number. In this example, the predetermined number of measurement sweeps is set equal to two. In step 32, a preliminary data set is acquired based on the two measurement sweeps. Statistical characteristics of the measurements within the preliminary data set, such as the mean and variance are computed by the processor in step 34. The statistical characteristics are compared to the user-specified limit contour or to a user-specified maximum permissible error in step 36. Based on the comparison in step 36, a decision is made in step 37 as to whether the measurements within the data set are sufficient to characterize the DUT. If the variance of the measurements in the data set is within the maximum permissible error by a sufficient amount, or if the mean and the variance of the measurements in the data set are within the limit contour by a sufficient amount, the measurement sequence is terminated. If these criteria are not met, the number of measurement sweeps is increased by acquiring subsequent data in step 38. Running statistical characteristics, such as the running mean and variance are performed once the subsequent data is combined with the measurements of the preliminary data set, in step 34.

When the comparison performed in step 36 determines that the DUT has been sufficiently characterized by the preliminary data set or the preliminary data set combined with subsequent measurements of the DUT, the measurement sequence may be terminated. The noise optimization increases the measurement speed of the DUT since the number of measurement sweeps is increased until the DUT is sufficiently characterized to meet performance criteria with a sufficient level of confidence. When the decision criteria are satisfied or if the measurements of the DUT are interrupted in step 37, the noise optimization is terminated.

Point optimization:

Measurement speed of the network analyzer is increased when measurements of a DUT are taken at a reduced number of stimulus points. However, indiscriminantly reducing the number of stimulus points generally results in less accurate characterization of the DUT. Point optimization determines the frequency locations of stimulus points and resulting increases in measurement speed are weighed against increases in measurement uncertainty, or error, of the network analyzer. Based on preliminary measurements of the DUT, the processor adjusts control signals C1, C2 to correspondingly adjust the frequencies of signal sources S1, S2 respectively, to determine the number and the frequency locations of stimulus points at which measurements of the DUT are performed.

Figure 2C:
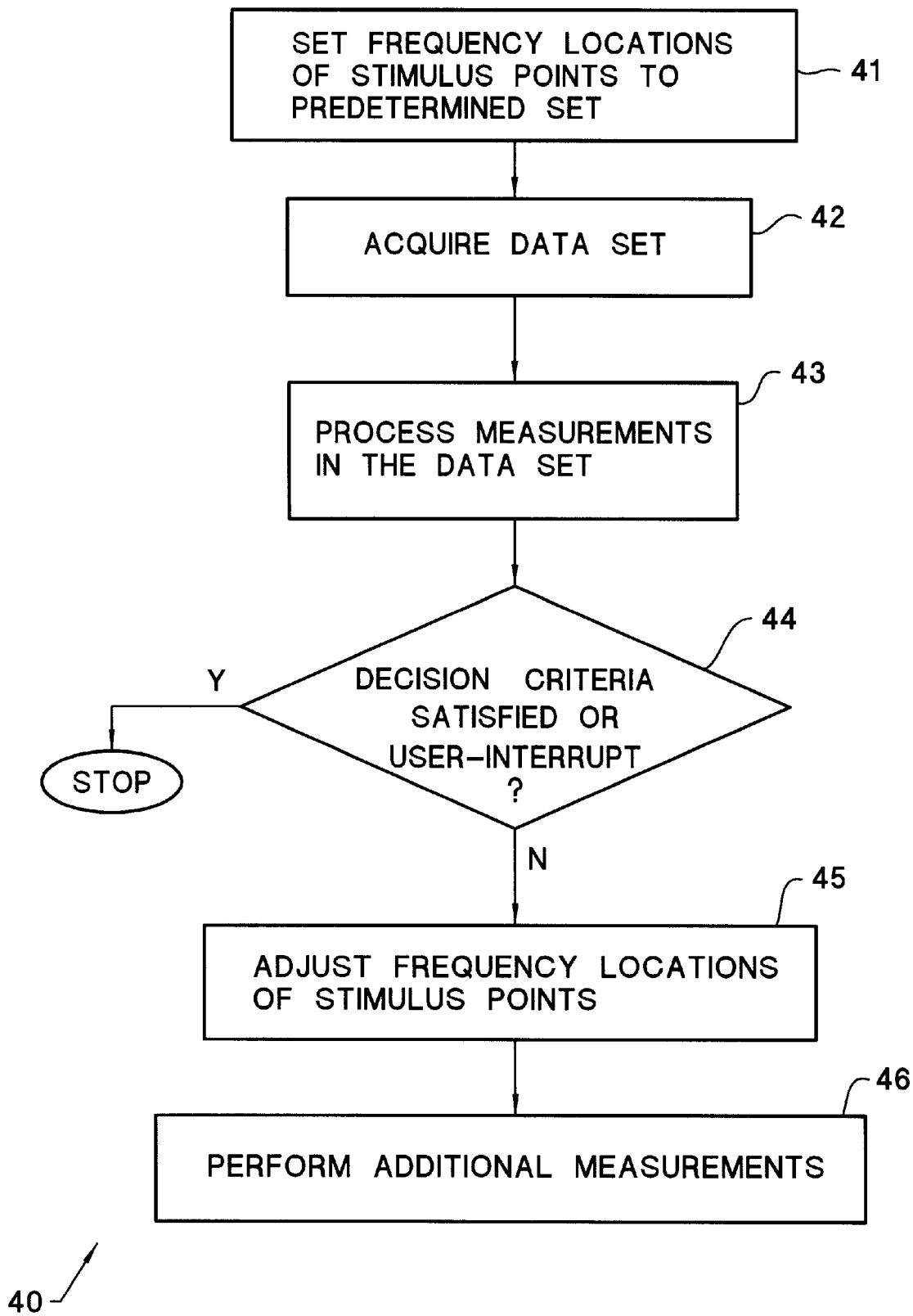
FIG. 2c shows a flow diagram of a network analyzer measurement method constructed according to the third preferred embodiment of the present invention.

FIG. 2c is a flow diagram 40 of the point optimization included in the measurement method constructed according to the third preferred embodiment of the present invention. In step 41, the number and frequency locations of stimulus points are adjusted to a predetermined set. The predetermined set is acquired from a previously characterized DUT or is a user-specified default set. A preliminary data set is then acquired at the predetermined set of stimulus points in step 42. In step 43, the measurements in the preliminary data set are processed. The processing may include curve-fitting the data to determine characteristics of the DUT at frequency locations between the measurement points in the predetermined set or may include determining the frequency locations of local minima, maxima, inflection points, derivatives or other characteristics of the DUT. Alternatively, the processing may include comparing the measured data in the data set to a user-specified limit contour, maximum permissible error or other decision criteria. Based on the processing of the measured data in the preliminary data set, control signals C1 or C2 are adjusted to correspondingly adjust the number and frequency locations, or density, of stimulus points at which subsequent measurements are performed. For example, in step 45, the density of stimulus points may be adjusted according to the proximity of the set of measurements to the limit contour. Subsequent data is acquired at the adjusted stimulus points in step 46. When the decision criteria are satisfied or if the measurements of the DUT are interrupted in step 44, the point optimization is terminated.

Subsequent measurements may be performed in fine frequency increments at local maxima or minima as predicted by the characteristics of the curve-fitting, whereas measurements may be performed at coarse frequency steps when no local maxima or minima are predicted by the curve-fitting or when the measurements in the preliminary data set are within the user-specified limit contour by a sufficient amount or within the maximum permissible error by a sufficient amount. The fine frequency increments provide for high measurement accuracy while the coarse frequency steps increase the measurement speed.

While the preferred embodiments of the present invention have been illustrated in detail, it should be apparent that modifications and adaptations to those embodiments may occur to one skilled in the art without departing from the scope of the present invention set forth in the following claims.

What is claimed is:

1. A measurement method adaptively adjusting the measurement bandwidth of a network analyzer to characterize a device under test, comprising the steps of:
    setting the measurement bandwidth of the network analyzer to a predetermined width;
    acquiring a set of measurements of the device under test while the measurement bandwidth is at the predetermined width;
    comparing the set of measurements to a decision criterion; and
    adjusting the measurement bandwidth of the network analyzer, acquiring additional measurements using the adjusted measurement bandwidth, updating the set of measurements with the additional measurements, comparing the set of measurements to the decision criterion, until one of an interrupt and a satisfaction of the decision criterion occurs.

2. The method of claim 1 wherein the step of adjusting the measurement bandwidth of the network analyzer includes adjusting the bandwidth of an analog filter.

3. The method of claim 1 wherein the step of adjusting the measurement bandwidth of the network analyzer includes adjusting the processing bandwidth of a digital filter.

4. The method of claim 1 further comprising the step of computing statistical characteristics of the set of measurements, wherein comparing the set of measurements to a decision criterion includes comparing the statistical characteristics to the decision criterion.

5. The method of claim 4 wherein the statistical characteristics include a mean and a variance of the set of measurements.

6. The method of claim 5 wherein the decision criterion is a limit contour for the device under test and satisfaction of the decision criterion occurs when the mean plus the variance of the set of measurements is within the limit contour by a predetermined amount.

7. The method of claim 5 wherein the decision criterion is a maximum permissible error and satisfaction of the decision criterion occurs when the variance is within the maximum permissible error by a predetermined amount.

8. The method of claim 1 wherein satisfaction of the decision criterion occurs when the set of measurements is within the limit contour by a predetermined amount.

9. The method of claim 1 wherein the decision criterion is a predefined amplitude and satisfaction of the decision criterion occurs when the set of measurements is within a predetermined range of the predefined amplitude.

10. A measurement method adaptively adjusting the number of measurement sweeps of a network analyzer for characterizing a device under test at at least one stimulus point, comprising the steps of:
    acquiring a set of measurements using a predetermined number of measurement sweeps;
    computing statistical characteristics of the set of measurements;
    comparing the statistical characteristics to a decision criterion; and
    increasing the number of measurement sweeps from the predetermined number of measurement sweeps to acquire additional measurements, combining the additional measurements to update the set of measurements, computing the statistical characteristics of the set of measurements, comparing the statistical characteristics to the decision criterion, until one of an interrupt and a satisfaction of the decision criterion occurs.

11. The method of claim 10 wherein the set of measurements includes at least two measurements of the device under test at each of the at least one stimulus point.

12. The method of claim 11 wherein computing the statistical characteristics includes calculating a mean and a variance of the set of measurements at the at least one stimulus point.

13. The method of claim 12 wherein the decision criterion is a limit contour for the device under test and satisfaction of the decision criterion occurs when the mean plus the variance are within the limit contour by a predetermined amount.

14. The method of claim 12 wherein the decision criterion is a maximum permissible error and satisfaction of the decision criterion occurs when the variance is within the maximum permissible error by a predetermined amount.

15. A measurement method adaptively adjusting the frequency locations of stimulus points of a network analyzer for characterizing a device under test, comprising the steps of:
    acquiring a set a measurements at predetermined frequency locations;
    processing the set of measurements;
    adjusting the frequency locations of stimulus points based on the processing;
    acquiring additional measurements at the adjusted stimulus points until one of an interrupt and a satisfaction of the decision criterion occurs.

16. The method of claim 15 wherein the decision criterion is a limit contour and the step of processing the set of measurements includes comparing the set of measurements to the limit contour.

17. The method of claim 16 wherein the step of adjusting the frequency locations of stimulus points includes adjusting the density of the frequency locations of the stimulus points according to the proximity of the set of measurements to the limit contour.

18. The method of claim 15 wherein the step of processing the set of measurements includes curve-fitting to the set of measurements.

19. The method of claim 18 wherein the step of adjusting the frequency locations of stimulus points includes positioning the stimulus points according to characteristics of the curve-fitting.

20. The method of claim 19 wherein the step of adjusting the frequency locations of stimulus points further includes adjusting the density of the frequency locations of the stimulus points according to at least one of a maxima and a minima determined by the curve-fitting.

* * * * *